United States Patent
Saraf

(10) Patent No.: US 6,920,595 B2
(45) Date of Patent: Jul. 19, 2005

(54) SKEWED LATCH FLIP-FLOP WITH EMBEDDED SCAN FUNCTION

(75) Inventor: Ritesh Saraf, Milpitas, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 548 days.

(21) Appl. No.: 09/822,166

(22) Filed: Mar. 30, 2001

(65) Prior Publication Data

US 2002/0178415 A1 Nov. 28, 2002

(51) Int. Cl.$^7$ .................. G06R 31/28; H03K 3/289; G06F 13/00

(52) U.S. Cl. .................. 714/731; 327/202; 710/61; 711/109

(58) Field of Search ................ 714/724, 726, 714/733, 731, 734, FOR 100; 327/202; 710/61; 711/109

(56) References Cited

U.S. PATENT DOCUMENTS

| 5,920,575 A | * | 7/1999 | Gregor et al. ............... 714/726 |
| 6,150,861 A | * | 11/2000 | Matsunaga et al. ......... 327/203 |
| 2002/0112208 A1 | * | 8/2002 | Kakizawa et al. .......... 714/738 |

* cited by examiner

Primary Examiner—Guy J. Lamarre
Assistant Examiner—Cynthia Britt
(74) Attorney, Agent, or Firm—Osha • Liang LLP

(57) ABSTRACT

A flip-flop circuit with embedded scan capabilities uses a skewed latch to pull one end of the flip-flop either up or down while another end of the flip-flop is active. Further, the flip-flop is designed such that a data node and a scan node are coupled to a master stage, which contains the skewed latch. The data node and scan node values are initially generated from different ends of the flip-flop. Based upon clock dependencies and whether the flip-flop is in a normal mode or a scan mode, the master stage passes a value to a slave stage dependent upon the data node and scan node values. Thereafter, the slave stage outputs a result based on the value passed from the master stage.

15 Claims, 9 Drawing Sheets

SKEWED LATCH FLIP-FLOP WITH EMBEDDED SCAN FUNCTION

BACKGROUND OF INVENTION

1. Field of the Invention

The present invention relates generally to flip-flops and relates more particularly to flip-flops with scan capabilities.

2. Background Art

The design of a computer system may be broken down into three parts—system design, logic design, and circuit design. System design involves breaking the overall system into subsystems and specifying the characteristics of each subsystem. For example, system design of a computer system could involve specifying the number and type of memory units, arithmetic units, and input-output devices as well as the interconnection and control of these subsystems. Logic design involves determining how to interconnect basic logic building blocks to perform a specific function. An example of logic design is determining the interconnection of logic gates and flip-flops to perform binary addition. Circuit design involves specifying the interconnection of specific components such as resistors, diodes, and transistors to form logic building blocks.

Two such logic building blocks are latches and flip-flops. A latch is a memory element that provides storage for at least one bit, i.e., it can at least store a '1' or a '0.' FIG. 1 shows a typical embodiment of a latch. The latch (10) shown in FIG. 1 has two NOR gates, NOR_1 (12) and NOR_2 (14), which are positioned in a symmetrical configuration. A first input to the latch (10), IN_1, serves as an input to NOR_1 (12), and a second input to the latch (10), IN_2, serves as an input to NOR_2 (14). The output of NOR_1 (12) is connected to both an output of the latch (10), OUT, and to a second input of NOR_2 (14). The output of NOR_2 (14) is connected to both a second output of the latch (10), $OUT_0$, and to a second input of NOR_1 (12).

When IN_1 goes high, i.e., '1,' $OUT_0$ is "reset" to low, i.e., '0.' Alternatively, when IN_2 goes high, $OUT_0$ is "set" to high. When both IN_1 and IN_2 go low, the value of $OUT_0$ goes to the value of OUT before IN_1 and IN_2 went low. Further, IN_1 and IN_2 are typically not allowed to go high at the same time, since doing so causes the latch (10) to become unstable. The behavior of the latch (10) shown in FIG. 1 (also known as a "Set-Reset latch") is summarized by the next state transition table given in Table 1.

TABLE 1

Next state transition table for latch referenced in FIG. 1

| IN_1 | IN_2 | OUT | $OUT_0$ |
|---|---|---|---|
| 0 | 0 | 0 | 0 |
| 0 | 0 | 1 | 1 |
| 0 | 1 | 0 | 1 |
| 0 | 1 | 1 | 1 |
| 1 | 0 | 0 | 0 |
| 1 | 0 | 1 | 0 |
| 1 | 1 | 0 | — |
| 1 | 1 | 1 | — |

Moreover, embodiments of latches that are not symmetrical, unlike the one depicted in FIG. 1, are called skewed latches.

Flip-flops, like latches, are memory elements that provide storage for at least one bit, i.e., it can at least store a '1' or a '0.' However, a flip-flop differs from a latch in that the output of the flip-flop is not only dependent on the present input, but also dependent on the past sequence of inputs. Additionally, a flip-flop differs from a latch in that a flip-flop is triggered by rising and/or falling edges of an input signal whereas a latch operates is level sensitive, i.e., operates on a high phase and/or low phase of an input signal.

FIG. 2 shows a typical embodiment of a flip-flop. The flip-flop (20) has two AND gates, AND_1 (22) and AND_2 (24), and two NOR gates, NOR_1 (26) and NOR_2 (28). A first input to the flip-flop (20), IN_1, serves as an input to AND_1 (22), and a second input to the flip-flop (20), IN_2, serves as an input to AND_2 (24). A clock input, CLK, also serves as an input to both AND_1 (22) and AND_2 (24). The output from AND_1 (22) serves as an input to NOR_1 (26), and the output from AND_2 (24) serves as an input to NOR_2 (28). The output from NOR_1 (26) is connected to an output of the flip-flop (20), OUT, a second input to NOR_2 (28), and to a third input to AND_1 (22). The output from NOR_2 (28) is connected to a second output of the flip-flop (20), $OUT_0$, a second input to NOR_1 (26), and to a third input to AND_2 (24).

The flip-flop (20) shown in FIG. 2 is designed such that it changes state a short time ($\epsilon$) after the falling edge of CLK provided that IN_1 and IN_2 have appropriate values. For example, if IN_1, IN_2, and $OUT_0$ are low in the present state before a CLK pulse, then after the CLK pulse, AND_1 (22) outputs low to an input of NOR_1 (26) and AND_2 (24) outputs low to an input of NOR_2 (28). Since $OUT_0$ was low before the clock pulse, a low was inputted to an input of NOR_1 (26), which, in turn, causes NOR_1 (26) to output high since both inputs to NOR_1 (26) are low. The high output from NOR_1 (26) goes to the second input of NOR_2 (28), which then causes NOR_2 (28) to output low to $OUT_0$ since one input to NOR_2 (28) is high and another input to NOR_2 (28) is low. In summary, when IN_1, IN_2, and $OUT_0$ are low in the present state, then in the next state, $OUT_0$ remains low.

The same procedure described above can be applied to any combination of present state inputs to determine the next state output. Note that the value of $OUT_0$ in the present state becomes the value of OUT in the next state. The behavior of the flip-flop (20) described in FIG. 2 (also known as a "clocked J-K flip-flop") is summarized by the next state transition table shown in Table 2.

TABLE 2

Next state transition table for flip-flop referenced in FIG. 2

| IN_1 | IN_2 | OUT | $OUT_0$ |
|---|---|---|---|
| 0 | 0 | 0 | 0 |
| 1 | 0 | 0 | 0 |
| 0 | 1 | 0 | 1 |
| 1 | 1 | 0 | 1 |
| 0 | 0 | 1 | 1 |
| 1 | 0 | 1 | 0 |
| 0 | 1 | 1 | 1 |
| 1 | 1 | 1 | 0 |

An important aspect of circuit design is how logic building blocks, such as latches and flip-flops, are actually implemented in a computer system. A typical approach used to implement logic building blocks is through the use of complementary metal-oxide-semiconductor ("CMOS") logic families.

CMOS logic families use metal-oxide-semiconductor field-effect ("MOSFET") transistors. The use of MOSFET transistors is beneficial because almost no current is needed to operate the transistors. However, MOSFETs operate slower than devices used in other logic families. MOSFETs may be divided into two types of transistors: positive-channel metal-oxide semiconductor ("PMOS") transistors and negative-channel metal-oxide semiconductor ("NMOS") transistors. A transistor is 'on' when there is an electrical pathway across the transistor such that a voltage at one terminal of the transistor can be seen at another terminal of the transistor. NMOS transistors can be switched 'on' or 'off' by the movement of electrons, whereas PMOS transistors can be switched 'on' or 'off' by the movement of electron vacancies. A MOSFET has a voltage threshold ("$V_T$") value, which is the voltage level at which the MOSFET switches 'on' or 'off.' Generally, a NMOS transistor switches 'on' when there is a high voltage applied to the input of the NMOS transistor and a PMOS transistor switches 'on' when there is a low voltage, e.g., ground, applied to the input of the PMOS transistor.

An implementation where the use of MOSFETs is exemplified involves a master-slave flip-flop, a type of flip-flop that is well known to those of ordinary skill in the art. FIG. 3 shows a typical embodiment of a master-slave flip-flop (30). The master-slave flip-flop (30) includes a master stage (32) that drives a slave stage (34).

The master stage (32) employs a first PMOS transistor (36), a first NMOS transistor (38), a first inverter (40), and a second inverter (42). The first PMOS transistor (36) and the first NMOS transistor (38) are in parallel (also referred to as "master transmission gate"), meaning that a terminal of the first PMOS transistor (36) is connected to a terminal of the first NMOS transistor (38) (also referred to as "first joint terminal") and a second terminal of the first PMOS transistor (36) is connected to a second terminal of the first NMOS transistor (38) (also referred to as "second joint terminal").

A data input, DATA, serves as an input to the master stage (32). DATA is connected to the first joint terminal of the first PMOS transistor (36) and the first NMOS transistor (38). An external clock signal, CLK, serves as an input to the first PMOS transistor (36). An external complement of CLK, CLK', serves as an input to the first NMOS transistor (38). The second joint terminal of the first PMOS transistor (36) and the first NMOS transistor (38) is connected to an input to the first inverter (40). The first inverter (40) outputs to both an input of the second inverter (42) and to the slave stage (34) of the master-slave flip-flop (30). The second inverter (42) outputs to the input of the first inverter (40).

The slave stage (34) employs a second PMOS transistor (44), a second NMOS transistor (46), a third inverter (48), and a fourth inverter (50). The second PMOS transistor (44) and the second NMOS transistor (46) are in parallel (also referred to as "slave transmission gate"), meaning that a terminal of the second PMOS transistor (44) is connected to a terminal of the second NMOS transistor (46) (also referred to as "third joint terminal") and a second terminal of the second PMOS transistor (44) is connected to a second terminal of the second NMOS transistor (46) (also referred to as "fourth joint terminal").

As discussed above, the output from the first inverter (40) in the master stage (32) serves as an input to the slave stage (34). The output from the first inverter (40) in the master stage (32) is connected to the third joint terminal of the second PMOS transistor (44) and the second NMOS transistor (46). The external complement of CLK, CLK', serves as an input to the second PMOS transistor (44). The clock signal, CLK, serves as an input to the second NMOS transistor (46). The fourth joint terminal of the second PMOS transistor (44) and the second NMOS transistor (46) is connected to an input to the third inverter (48). The third inverter (48) outputs to both an input to the fourth inverter (50) and to an output of the master-slave flip-flop (30), OUT. The fourth inverter (50) outputs to the input of the third inverter (48).

When CLK goes low, the first PMOS transistor (36) switches 'on.' Since CLK goes low, CLK' accordingly goes high, and the first NMOS transistor (38) switches 'on.' Because both the first PMOS transistor (36) and the first NMOS transistor (38) switch 'on,' the master transmission gate is conducting, i.e., the master transmission gate is 'on,' and DATA passes through the master transmission gate to the input of the first inverter (40). The first inverter (40) then outputs an inverted DATA value to both the input of the second inverter (42) and to the input of the slave stage (34). The second inverter (42) outputs a buffered, non-inverted value of DATA back to the input of the first inverter (40). The main function of the second inverter (42) is to ensure that the first inverter (40) holds its output even if the conduction of DATA through the master transmission gate attenuates.

Since CLK goes low and CLK' follows high, the second NMOS transistor (46) and the second PMOS transistor (44) switch 'off,' respectively. Because both the second PMOS transistor (44) and the second NMOS transistor (46) switch 'off,' the slave transmission gate does not conduct, i.e., the slave transmission gate is 'off,' and the input to the slave stage (34) from the output of the first inverter (40) in the master stage (32) does not pass through the slave transmission gate to the input of the third inverter (48).

Alternatively, when CLK goes high and CLK' follows low, the first PMOS transistor (36) and the first NMOS transistor (38) switch 'off,' respectively. Accordingly, this causes the master transmission gate to switch 'off' so that DATA does not pass through the master transmission gate to the input of the first inverter (40). However, recall that, due to the function of the second inverter (42), the first inverter (40) continues to output the value that was being outputted by it when the master transmission gate was switched 'on.'

Since CLK goes high and CLK' follows low, the second PMOS transistor (44) and the second NMOS transistor (46) switch 'on,' respectively. Accordingly, this causes the slave transmission gate to switch 'on' so that the output from the first inverter (40) passes through the slave transmission gate to the input of the third inverter (48). The third inverter (48) then outputs an inverted value of the input to the slave stage (34) from the first inverter (40) to both the input of the fourth inverter (50) and to OUT. The fourth inverter (50) outputs a buffered, non-inverted value of the input to the slave stage (34) back to the input of the third inverter (48). The main function of the fourth inverter (50) is to ensure that the third inverter (42) holds its output even if the conduction of the input to the slave stage (34) through the master transmission gate attenuates.

In summary, in the master-slave flip-flop (30) shown in FIG. 3, data is passed from the input of the master-slave flip-flop (30) to the output of the master-slave flip-flop (30) sequentially through a master stage (32) and a slave stage (34). When the master stage (32) is active, data is passed through the master stage (32) to the slave stage (34), and when the slave stage (34) is active, data is passed from the output of the master stage (32) to the output of the master-slave flip-flop (30). Further, the master stage (32) and slave stage (34) are typically not either both active or inactive at the same time.

An additional feature of a master-slave flip-flop, and other types of flip-flops, involves including scan capabilities in addition to conventional flip-flop functions. Scan circuitry is added to a flip-flop on top of the flip-flop circuitry to allow data within a flip-flop to be scanned or scan data to be inputted into the flip-flop to test the functionality of the flip-flop. Flip-flops with scan circuitry are often used in high performance systems such as high-speed microprocessors.

FIG. 4 shows a typical embodiment of a flip-flop with scan capabilities. The flip-flop with scan capabilities (60) shown in FIG. 4 includes a first stage (62) and a second stage (74).

The first stage (62) employs a first PMOS transistor (64), a first NMOS transistor (66), a second PMOS transistor (68), a second NMOS transistor (70), and a latch block (72). The first PMOS transistor (64) and the first NMOS transistor (66) are in parallel (also referred to as "data transmission gate"), meaning that a terminal of the first PMOS transistor (64) is connected to a terminal of the first NMOS transistor (66) (also referred to as "first joint terminal") and a second terminal of the first PMOS transistor (64) is connected to a second terminal of the first NMOS transistor (66) (also referred to as "second joint terminal"). The second PMOS transistor (68) and the second NMOS transistor (70) are also in parallel (also referred to as "scan transmission gate"), meaning that a terminal of the second PMOS transistor (68) is connected to a terminal of the second NMOS transistor (70) (also referred to as "third joint terminal") and a second terminal of the second PMOS transistor (68) is connected to a second terminal of the second NMOS transistor (70) (also referred to as "fourth joint terminal"). The second joint terminal of the first PMOS transistor (64) and the first NMOS transistor (66) is connected to an input of the latch block (72). Likewise, the fourth joint terminal of the second PMOS transistor (68) and the second NMOS transistor (70) is connected to the input of the latch block (72). The latch block (72) functions as a latch (described above in reference to FIG. 1), and outputs to the second stage (74), which functions similarly to a slave stage (described above in reference to FIG. 3).

A clock signal, CLK, serves as an input to the first stage (62). CLK is connected to an input of the first PMOS transistor (64). A data input, DATA, also serves as an input to the first stage (62). DATA is connected to the first joint terminal of the first PMOS transistor (64) and the first NMOS transistor (66). Additionally, a complement of CLK, CLK', serves as an input to the first stage (62). CLK' is connected to an input of the first NMOS transistor (66).

A scan clock signal, SCLK, serves as an input to the first stage (62). SCLK is connected to an input of the second PMOS transistor (68). A scan input, SI, also serves as an input to the first stage (62). SI is connected to the third joint terminal of the second PMOS transistor (68) and the second NMOS transistor (70). Additionally, a complement of SI, SI', serves as an input to the first stage (62). SI' is connected to an input of the second NMOS transistor (70).

During normal mode operation of the flip-flop with scan capabilities (60), CLK is enabled and SCLK is disabled. Accordingly, as CLK pulses (causing CLK' to also pulse), the data transmission gate continuously switches 'on' and 'off' at the rate at which CLK pulses. This allows DATA to pass through the data transmission gate to the input of the latch block (72) during the cycles when the data transmission gate is switched 'on.'

Alternatively, during scan mode operations, SCLK is enabled and CLK is disabled. Accordingly, as SCLK pulses (causing SCLK' to also pulse), the scan transmission gate continuously switches 'on' and 'off' at the rate at which SCLK pulses. This allows SI to pass through the scan transmission gate to the input of the latch block (72) during the cycles when the scan transmission gate is switched 'on.'

SUMMARY OF INVENTION

In one aspect, a flip-flop circuit with embedded scan capabilities and having a master stage and a slave stage comprises a data input control stage that selectively controls a value on a data node that is coupled to the master stage and the slave stage and scan input control stage that selectively controls a value on a scan node that is coupled to the master stage.

In another aspect, the master stage, which comprises a skewed latch, pulls one end of the flip-flop circuit either up or down while another end of the flip-flop circuit is active.

In another aspect, a method for performing operations using a flip-flop with embedded scan capabilities and having a master stage and a slave stage comprises selectively controlling a value on a data node dependent upon a data input control stage and a clock input control stage, wherein the data node is coupled to the master stage and the slave stage, selectively controlling a value on a scan node dependent upon a scan input control stage and the clock input control stage, wherein the scan node is coupled to the master stage, selectively controlling the slave stage dependent upon the master stage and the clock input control stage, and selectively generating an output of the flip-flop dependent upon the slave stage.

Other aspects and advantages of the invention will be apparent from the following description and the appended claims.

DETAILED DESCRIPTION

The present invention relates to a method for performing operations using a flip-flop with embedded scan logic. The present invention also relates to a method for increasing performance in the presence of a flip-flop with embedded scan logic. The present invention further relates to a method for storing data and scanning to check stored data using a flip-flop with embedded scan logic. The present invention also relates to a method for performing operations using a master-slave flip-flop with embedded scan capabilities. The present invention further relates to an apparatus for performing operations using a flip-flop with embedded scan logic.

The present invention also relates to an apparatus that increases performance in the presence of a flip-flop with scan logic. The present invention further relates to an apparatus that stores data and scans to check stored data using a flip-flop with embedded scan logic. The present invention also relates to an apparatus that performs operations using a master-slave flip-flop with embedded scan capabilities.

An embodiment of the present invention uses embedded scan logic within flip-flop logic. The flip-flop has a data input on one end and a scan input on another end of the flip-flop. The flip-flop also has a skewed latch that ensures that one end of the flip-flop is constantly pulled up or down while the other end is active.

Figure 1:
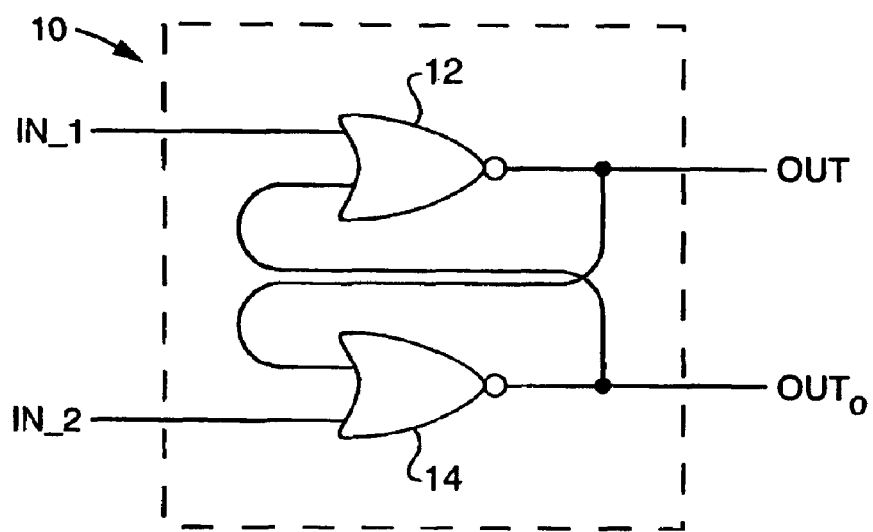
FIG. 1 shows a prior art embodiment of a latch.
Figure 2:
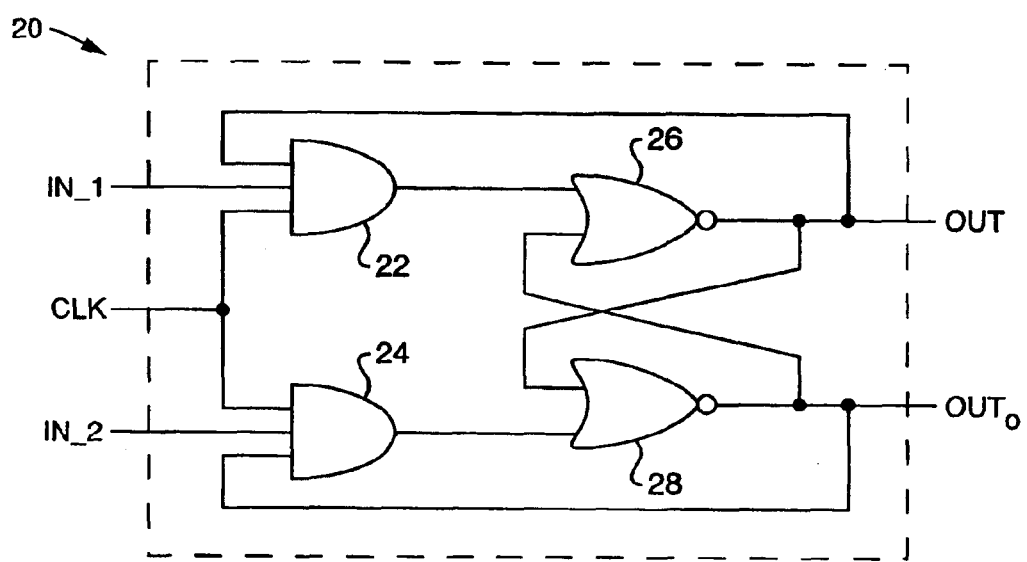
FIG. 2 shows a prior art embodiment of a flip-flop.
Figure 3:
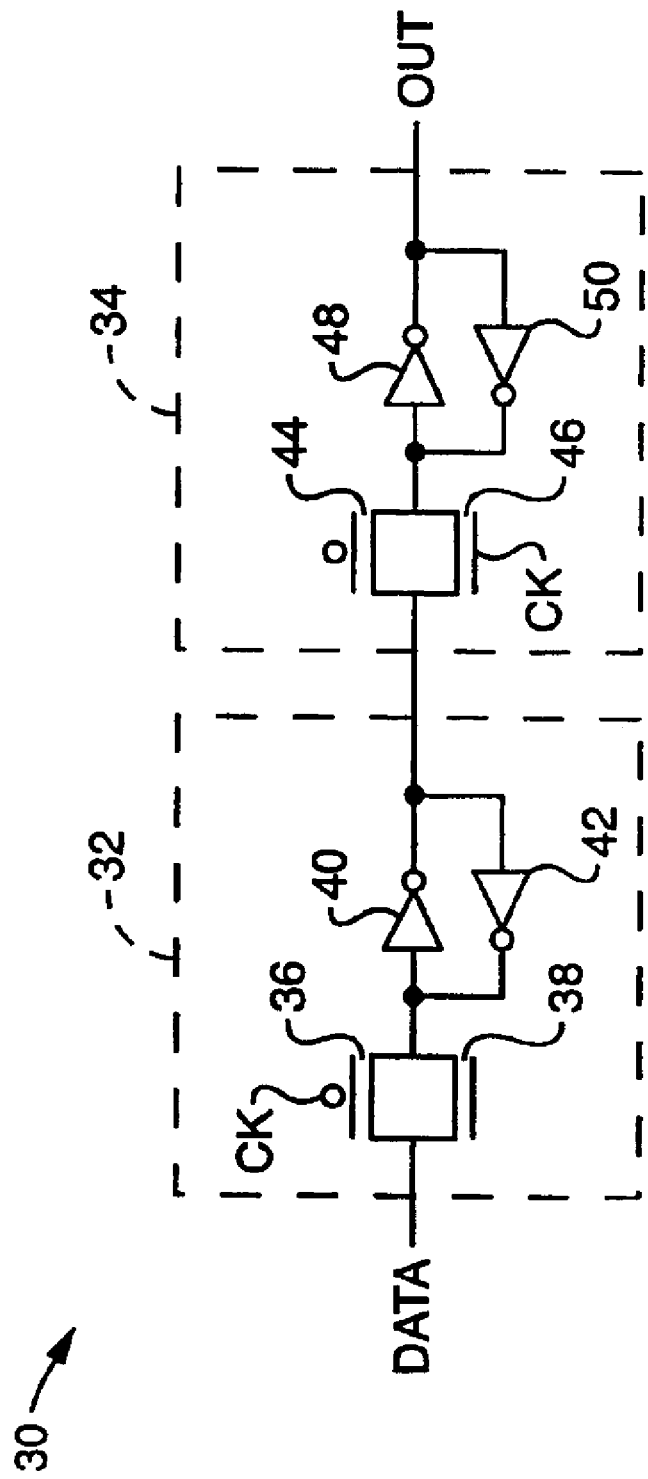
FIG. 3 shows a prior art embodiment of a master-slave flip-flop.
Figure 4:
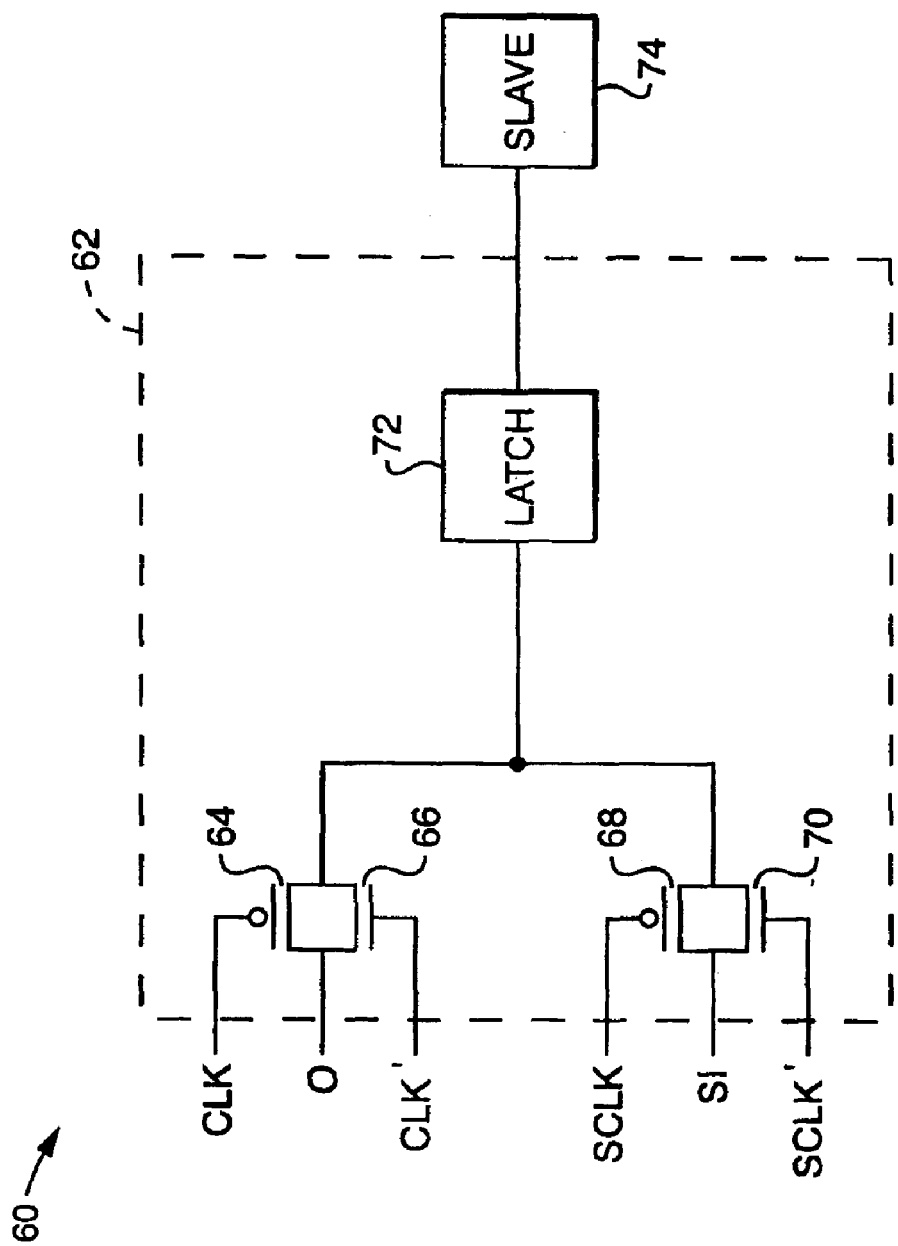
FIG. 4 shows a prior art embodiment of a flip-flop with scan capabilities.
Figure 5:
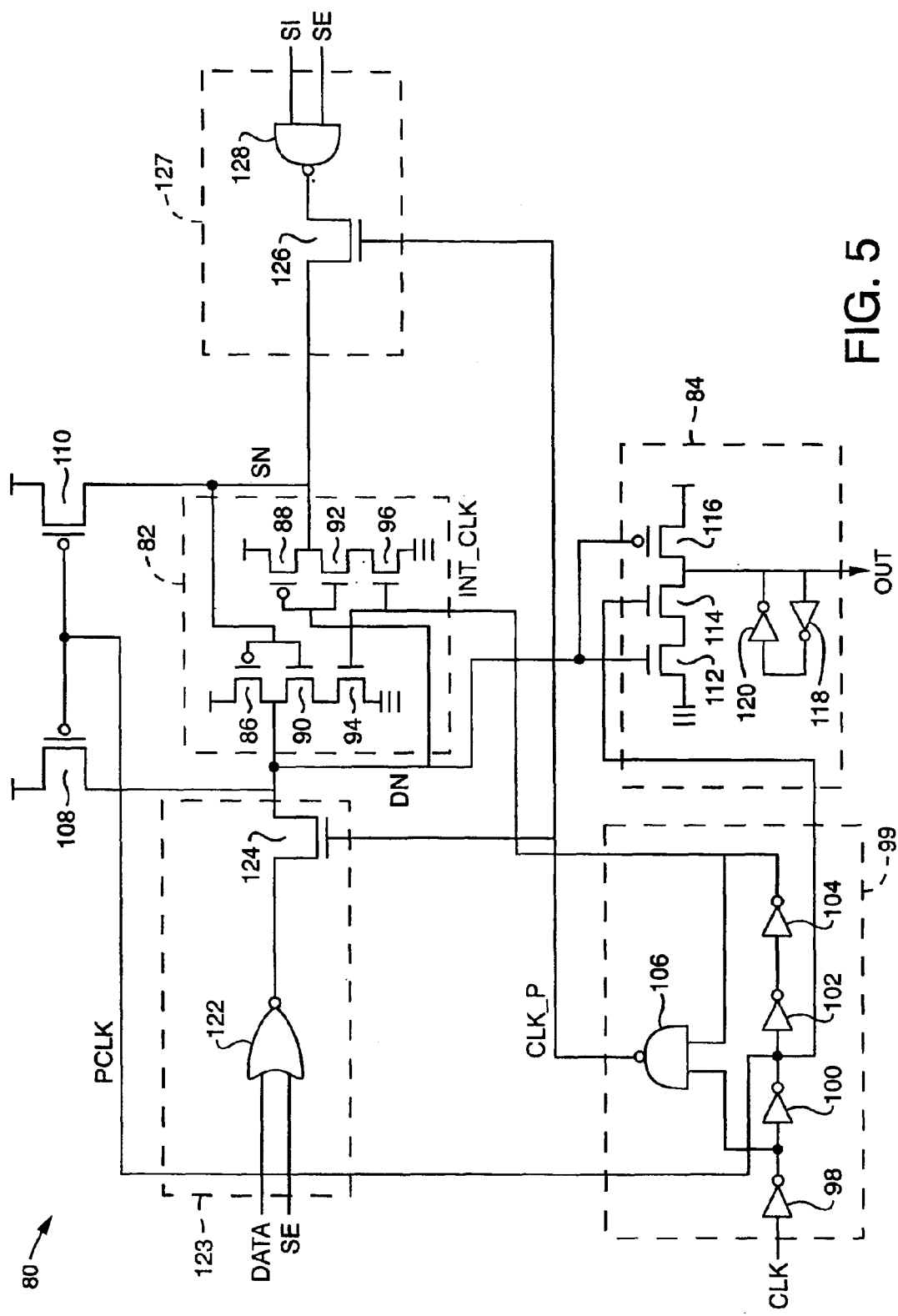
FIG. 5 shows a flip-flop with embedded scan capabilities in accordance with an embodiment of the present invention.

FIG. 5 shows an exemplary flip-flop with embedded scan logic in accordance with an embodiment of the present invention. The flip-flop with embedded scan logic (80) includes, among other circuitry, a master stage (82) and a slave stage (84).

The master stage (82), which represents a skewed latch, includes a first PMOS transistor (86), a second PMOS transistor (88), a first NMOS transistor (90), a second NMOS transistor (92), a third NMOS transistor (94), and a fourth NMOS transistor (96). The first PMOS transistor (86) has one terminal connected to a voltage source (also referred to as "connected to high"), and another terminal connected to a terminal of the first NMOS transistor (90). The first NMOS transistor (90), in addition to having a terminal connected to a terminal of the first PMOS transistor (86), has another terminal connected to a terminal of the third NMOS transistor (94). The third NMOS transistor (94), in addition to having a terminal connected to a terminal of the second NMOS transistor (92), has another terminal connected to ground (also referred to as "connected to low"). The second PMOS transistor (88) has a terminal connected to high and another terminal connected to a terminal of the second NMOS transistor (92). The second NMOS transistor (92), in addition to having a terminal connected to a terminal of the second PMOS transistor (88), has another terminal connected to a terminal of the fourth NMOS transistor (96). The fourth NMOS transistor (96), in addition to having a terminal connected to a terminal of the second NMOS transistor (92), has another terminal connected to ground.

The slave stage (84) has an eighth NMOS transistor (112), a seventh NMOS transistor (114), a fifth PMOS transistor (116), a fifth inverter (118), and a sixth inverter (120). The eighth NMOS transistor (112) has a terminal connected to ground and another terminal connected to a terminal of the seventh NMOS transistor (114). The seventh NMOS transistor (114), in addition to having a terminal connected to a terminal of the eighth NMOS transistor (112), has another terminal connected to both the output of the flip-flop with embedded scan logic (80), OUT, and a terminal of the fifth PMOS transistor (116). The fifth PMOS transistor (116), in addition to having a terminal connected to both a terminal of the seventh NMOS transistor (114) and OUT, has another terminal connected to high. The fifth inverter (118) inputs the value to OUT, performs an inversion operation, and then outputs the result to an input to the sixth inverter (120). The sixth inverter (120) then inverts the input received from the fifth inverter (118), and then outputs the result to OUT.

A clock signal, CLK, serves as an input to the flip-flop with embedded scan logic (80). A first inverter (98) inputs CLK, inverts CLK, and then outputs an inverted CLK signal to both an input of a first NAND gate (106) and to an input of a second inverter (100). Note that the inverted CLK signal outputted by the first inverter (98) is delayed by a one inverter delay (98) relative to CLK.

The second inverter (100) inverts the inverted CLK signal, and then outputs a non-inverted CLK signal to a pre-charge clock node, PCLK. Note that the non-inverted CLK signal outputted by the second inverter (100) is delayed by two inverter delays (98, 100) relative to CLK. The non-inverted CLK signal outputted from the second inverter (100) also serves as an input to both a third inverter (102) and the seventh NMOS transistor (114). PCLK serves as an input to both a third PMOS transistor (108) and a fourth PMOS transistor (110).

The third inverter (102) inverts the non-inverted CLK signal and outputs an inverted CLK signal to an input to a fourth inverter (104). Note that the inverted CLK signal outputted by the third inverter (102) is delayed by three inverter delays (98, 100, 102) relative to CLK. The fourth inverter (104) inverts the inverted CLK signal and outputs a buffered non-inverted CLK signal that is connected to an internal clock node, INT_CLK. Note that the buffered non-inverted CLK signal is delayed by four inverter delays (98, 100, 102, 104) relative to CLK. INT_CLK serves as an input to the first NAND gate (106), as an input to the third NMOS transistor (94), and as an input to the fourth NMOS transistor (96). Another function of the third and fourth inverters (102, 104) is to buffer CLK such that any voltage dissipation and/or stray voltage addition is removed from CLK. Further, the buffer formed by the third and fourth inverters (102, 104) ensures that a signal based on CLK going to the rest of the flip-flop with embedded scan logic (80) has an accurate rising edge. In summary, the first, second, third, and fourth inverters (98, 100, 102, 104) are configured as described in order to ensure that CLK gets buffered and that delayed versions of CLK are available. Moreover, the first, second, third, and fourth inverters (98, 100, 102, 104), along with the first NAND gate (106), form a clock input control stage (99).

The first NAND gate (106) performs a NAND operation based on its inputs and then outputs the result to a clock pulse node, CLK_P. CLK_P serves as an input to both a fifth NMOS transistor (124) and a sixth NMOS transistor (126).

A data input, DATA, and a scan enable signal, SE, serve as inputs to one end of the flip-flop with embedded scan logic (80). A first NOR gate (122) inputs DATA and SE, performs a NOR operation based on those inputs, and then outputs the result to a terminal of the fifth NMOS transistor (124). In addition to having a terminal that is connected to the output of the first NOR gate (122), the fifth NMOS transistor (124) has another terminal that is connected to both a terminal of the third PMOS transistor (108) and a data node, DN. The third PMOS transistor (108), in addition to having a terminal that is connected to a terminal of the fifth NMOS transistor (124), has another terminal that is connected to high. DN is connected to a terminal of the first PMOS transistor (86), a terminal of the first NMOS transistor (90), an input to the second PMOS transistor (88), an input to the second NMOS transistor (92), an input to the eighth NMOS transistor (112), and an input to the fifth PMOS transistor (116). Moreover, the first NOR gate (122) and the fifth NMOS transistor (124) form a data input control stage (123).

A scan input, SI, and SE serve as inputs to another end of the flip-flop with embedded scan logic (80). A second NAND gate (128) inputs SI and SE, performs a NAND operation based on those inputs, and then outputs the result to a terminal of the sixth NMOS transistor (126). In addition to having a terminal that is connected to the output of the second NAND gate (128), the sixth NMOS transistor (126) has another terminal that is connected to both a terminal of the fourth PMOS transistor (110) and a scan node, SN. The fourth PMOS transistor (110), in addition to having a terminal that is connected to a terminal of the sixth NMOS transistor (126), has another terminal that is connected to high. SN is connected to a terminal of the second PMOS transistor (88), a terminal of the second NMOS transistor (92), an input to the first PMOS transistor (86), and an input to the first NMOS transistor (90). Moreover, the second NAND gate (128) and the sixth NMOS transistor (126) form a scan input control stage (127).

When CLK makes a transition from low to high, the fourth inverter (104) outputs, via INT_CLK, the buffered non-inverted CLK signal transition to the inputs of the third NMOS transistor (94) and the fourth NMOS transistor (96). As the buffered CLK goes high, the third and fourth NMOS transistor (94, 96) switch 'on,' causing a connection to be formed between a terminal of the first NMOS transistor (90) and ground, and another connection to be formed between a terminal of the second NMOS transistor (92) and ground. The first PMOS transistor (86) and the first NMOS transistor (90) are sized such that the first PMOS transistor (86) is stronger than the first NMOS transistor (90). Alternatively, the second PMOS transistor (88) and the second NMOS transistor (92) are sized such that the second NMOS transistor (92) is much stronger than the second PMOS transistor (88). This ensures that DN has a tendency to be at a high logic level and that SN has a tendency to be at a low logic level.

The first NOR gate (122) controls the data transmission onto DN for normal mode operations and the second NAND gate (128) controls the scan data transmission onto SN for scan operations. Further, DN and SN are pre-charged to a high logic level when PCLK is low. This happens because the third PMOS transistor (108) and the fourth PMOS transistor (110) both switch 'on' when PCLK goes low, which, in effect, causes DN and SN to get connected to high through the third PMOS transistor (108) and the fourth PMOS transistor (110), respectively. Also, when PCLK goes low, the seventh NMOS transistor (114) switches 'off.'

During normal mode operations, SE is disabled, i.e., it is held low. This causes the output of the second NAND gate (128) to go and remain high since any low input to a NAND gate causes the NAND gate to output high. It follows that during normal mode operations, the terminal of the sixth NMOS transistor (126) that is connected to the output of the second NAND gate (128) is always high. Further, during normal mode operations, the first NOR gate (122) outputs the inverted value of DATA because whenever one input to a two-input NOR gate is low, its output is the inverted value of the second input.

Alternatively, during scan mode operations, SE is enabled, i.e., it is held high. This causes the output of the first NOR gate (122) to go and remain low since any high input to a NOR gate causes the NOR gate to output low. It follows that the terminal of the fifth NMOS transistor (124) that is connected to the output of the first NOR gate (122) is always low. Further, during scan mode operations, the second NAND gate (128) outputs the inverted value of SI because whenever one input to a two-input NAND gate is high, its output is the inverted value of the second input.

The fifth and sixth NMOS transistors (124, 126) switch 'on' when CLK_P goes high. CLK_P, as discussed above, is outputted by the first NAND gate (106), which inputs two delayed CLK signals that are complements of each other.

The fifth and sixth inverters (118, 120) in the slave stage (84) are configured as such to ensure that the value on OUT is held even if the value at the terminal of the fifth PMOS transistor (116) that is connected to OUT oscillates without being driven by either the fifth PMOS transistor (116) or by the combination of the seventh and eighth NMOS transistors (114, 112). In other words, when the seventh NMOS transistor (114) and the fifth PMOS transistor (116) are switched 'off,' the fifth and sixth inverter (118, 120) form a latch that holds the data at OUT. Moreover, the fifth and sixth inverters (118, 120) are sized such that they are strong enough to hold the current value of OUT, but not strong enough to drive OUT to a different value.

Those skilled in the art will appreciate that in other embodiments of the present invention, transistors and logic gates can be sized to achieve specific behavior within the flip-flop with embedded scan logic. Those skilled in the art will also appreciate that in other embodiments, the circuitry described for the flip-flop in FIG. 5 can be rearranged and/or substituted with different circuit components. For instance, those skilled in the art will appreciate that in other embodiments of the present invention, logic other than CMOS logic, such as transistor-transistor logic ("TTL") or resistor-transistor logic ("RTL"), can be used.

Figure 6A:
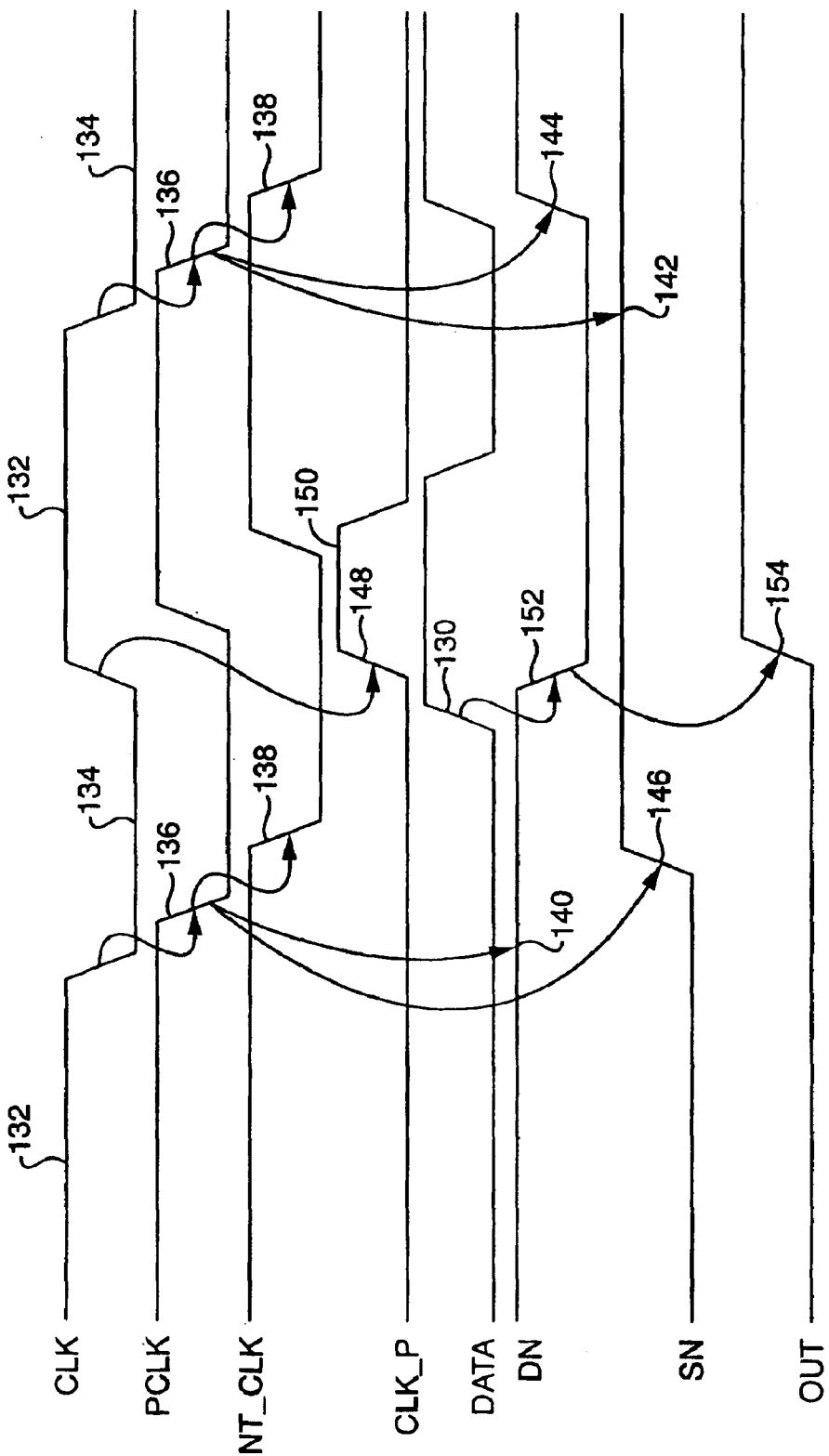
FIG. 6A shows an exemplary timing diagram in accordance with an embodiment of the present invention.

FIG. 6A shows an exemplary timing diagram of a function of the flip-flop with embedded scan logic (80) referenced in FIG. 5. The timing diagram in FIG. 6A represents the function of the flip-flop with embedded scan logic (80) during normal mode operations, i.e., the scan enable signal is low, when the data input, DATA, goes from low to high (130).

FIG. 6A shows the behavior of the clock signal, CLK, the pre-charge node, PCLK, the internal clock node, INT_CLK, the clock pulse node, CLK_P, the data input, DATA, the data node, DN, the scan node, SN, and the output, OUT. CLK continuously pulses between high (132) and low (134) independent of the behavior of the circuitry within the flip-flop with embedded scan logic (80). At the falling edge of CLK, PCLK follows CLK (136) with a two inverter delay, due to the first and second inverters (98, 100), and INT_CLK follows CLK (138) with a four inverter delay (98, 100, 102, 104). At the falling edges of PCLK, i.e., when PCLK goes low, the third PMOS transistor (108) and the fourth PMOS transistor (110) switch 'on,' causing DN and SN to remain high (140, 142) or causing DN and SN to go high (144, 146).

At the rising edge of CLK, CLK_P goes high (148), because, due to CLK going high, one of the inputs to the first NAND gate (106) goes low, causing the first NAND gate (106) to output high on CLK_P. CLK_P pulses high for three inverter delays (150), i.e., the width of a CLK_P pulse is three inverter delays, due to the propagation delays inherent in the second, third, and fourth inverters (100, 102, 104). When CLK_P goes high (148), the fifth and sixth NMOS transistors (124, 126) switch 'on.' When the sixth NMOS transistor (126) switches 'on,' SN, which was already high, due to SN going high (146) when PCLK went low earlier, gets connected to the high output of the second NAND gate (128). As discussed earlier, during normal mode operations, SE is disabled, and therefore, the second NAND gate (128) outputs high. When the fifth NMOS transistor (124) switches 'on' due to CLK_P going high (148), and when DATA goes high (130), then DN goes low (152) since it gets connected to the output of the first NOR gate (122)

through the fifth NMOS transistor (124). As DN goes low (152), the fifth PMOS transistor (116) switches 'on,' causing OUT to go high (154) since OUT gets connected to high through the fifth PMOS transistor (116).

In other words, when DATA goes high (130), the first NOR gate (122) outputs low (as discussed earlier), and since the fifth NMOS transistor (124) is switched 'on,' DN gets connected to low and discharges (152). Subsequently, when INT_CLK goes high, the values on DN and SN get latched, i.e., stored. Consequently, DN switches the fifth PMOS transistor (116) 'on,' causing OUT to go high (154) since it gets connected to high through the fifth PMOS transistor (116).

Figure 6B:
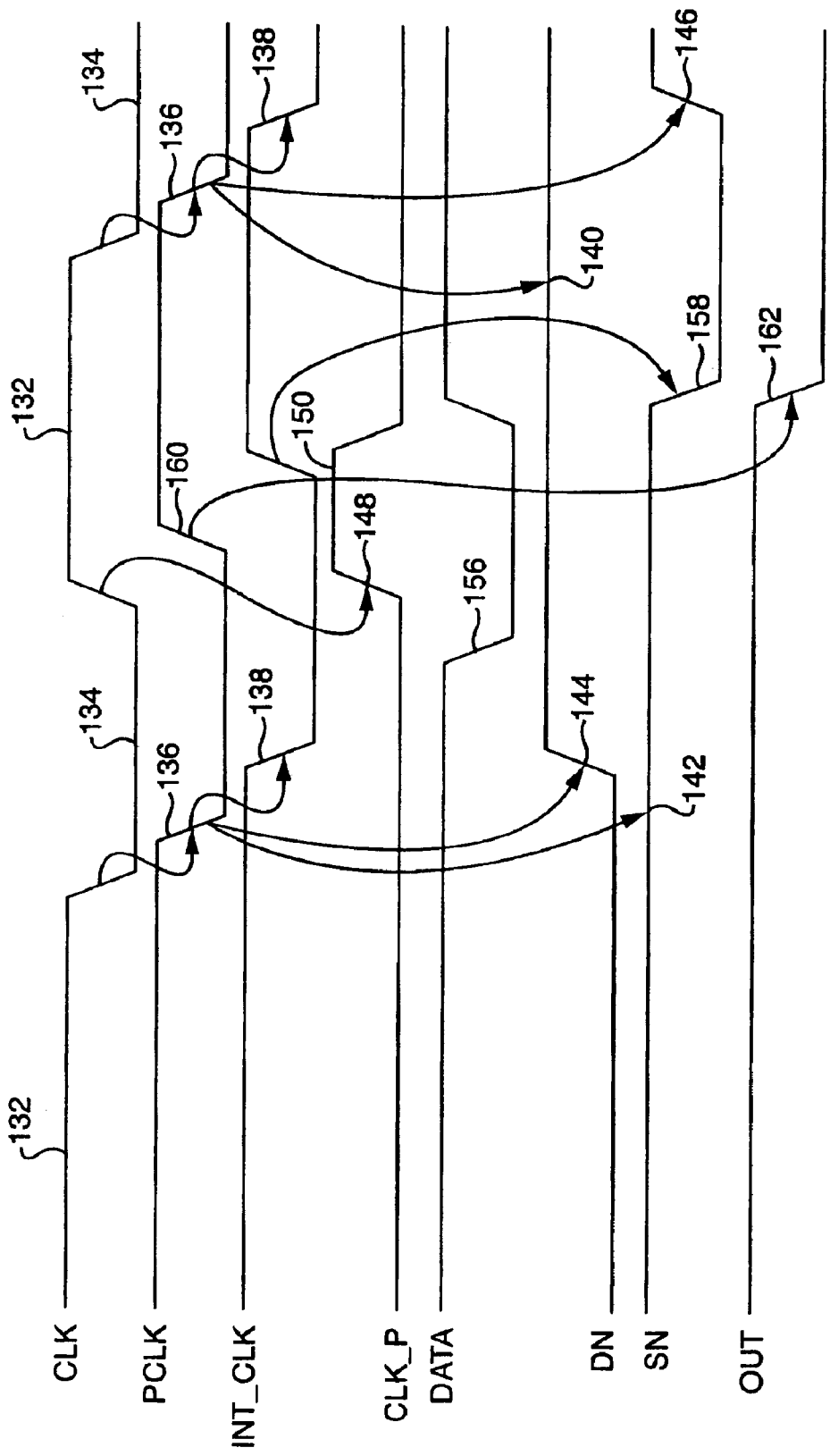
FIG. 6B shows an exemplary timing diagram in accordance with an embodiment of the present invention.

The timing diagram in FIG. 6B represents the function of the flip-flop with embedded scan logic (80) during normal mode operations, i.e., the scan enable signal is low, when the data input, DATA, goes from high to low. In the case that the fifth NMOS transistor (124) is switched 'on' and DATA goes low (156), the first NOR gate (122) outputs high since a two-input NOR gate outputs the inverse of the second input when its first input, SE, is low. Moreover, when DATA goes low and the fifth NMOS transistor (124) switches 'on,' DN gets connected to the high output of the first NOR gate (122), and remains high since it was already high from the time it went high when PCLK went low (136). It follows that both DN and SN are now high. When INT_CLK goes high and CLK_P goes low, the third NMOS transistor (94) switches 'on,' the fourth NMOS transistor (96) switches 'on,' the fifth NMOS transistor (124) switches 'off,' and the sixth NMOS transistor (126) switches 'off.' Since SN and DN are both high, the first PMOS transistor (86) is switched 'off,' the first NMOS transistor (90) is switched 'on,' the second PMOS transistor (88) is switched 'off,' and the second NMOS transistor (92) is switched 'on.' Because the first PMOS transistor (86) is stronger than the first NMOS transistor (90) and because the second NMOS transistor (92) is stronger than the second PMOS transistor (88), SN is discharged (158) since it gets connected to ground, i.e., gets discharged, through the second and fourth NMOS transistors (92, 96). An arriving rising edge on PCLK (160) enables the data on DN to flow to OUT since the PCLK rising edge and the high value on DN switch the seventh and eighth NMOS transistors (114, 112) 'on,' respectively. Accordingly, OUT goes low (162) since it gets connected to ground through the seventh and eighth NMOS transistors (114, 112).

Figure 7A:
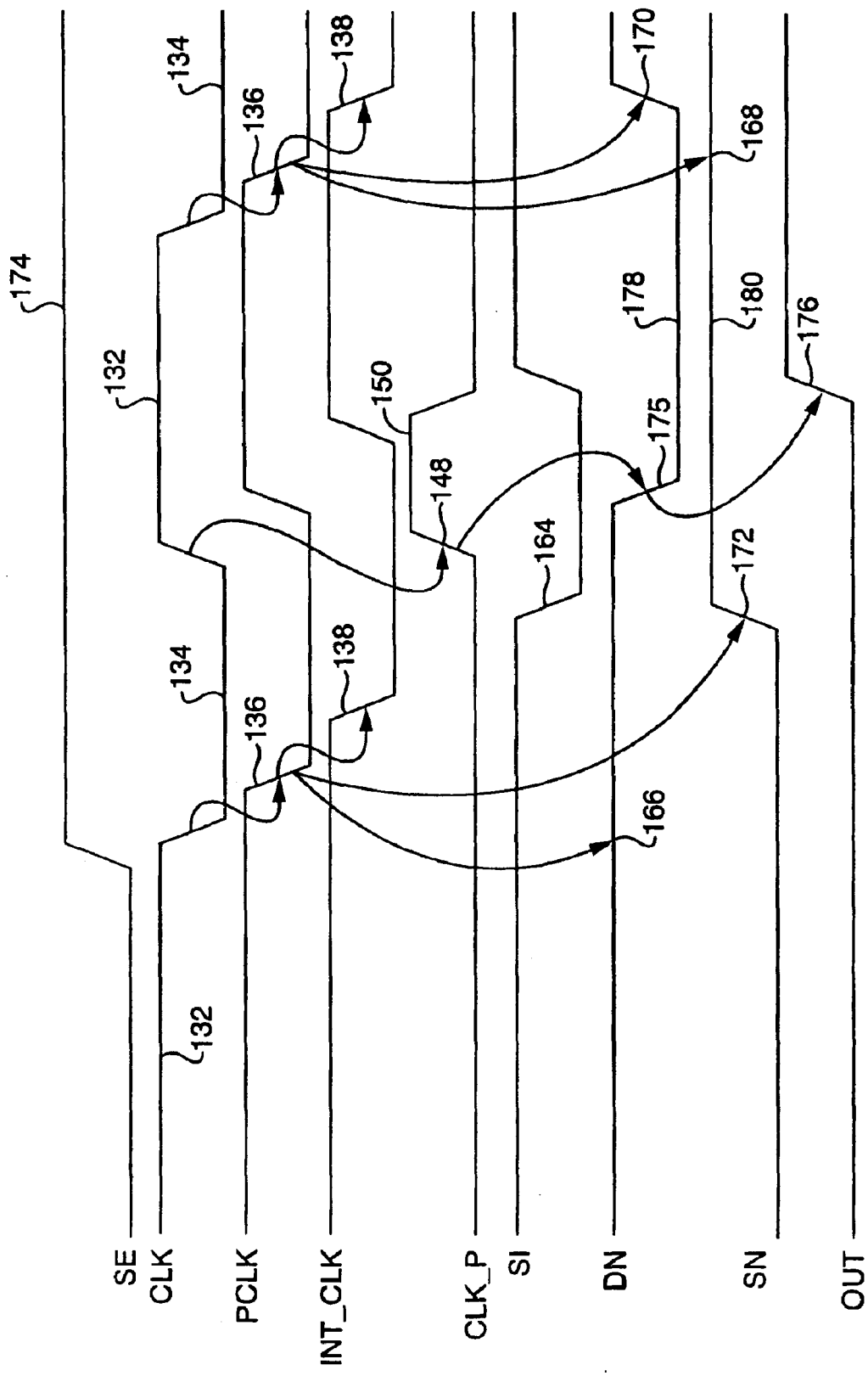
FIG. 7A shown an exemplary timing diagram in accordance with an embodiment of the present invention.

FIG. 7A shows an exemplary timing diagram of a function of the flip-flop with embedded scan logic (80) referenced in FIG. 5. The timing diagram in FIG. 7A represents the function of the flip-flop with embedded scan logic (80) during scan mode operations, i.e., the scan enable signal is high and the data input is disabled, when the scan input, SI, goes from high to low (164).

FIG. 7A shows the behavior of the scan enable signal, SE, clock signal, CLK, the pre-charge node, PCLK, the internal clock node, INT_CLK, the clock pulse node, CLK_P, the scan input, SI, the data node, DN, the scan node, SN, and the output, OUT. CLK continuously pulses between high and low (132, 134) independent of the behavior of the circuitry within the flip-flop with embedded scan logic (80). At the falling edge of CLK, PCLK follows CLK (136) with a two inverter delay, due to the first and second inverters (98, 100), and INT_CLK follows CLK (138) with a four inverter delay (98, 100, 102, 104). At the falling edges of PCLK (136), i.e., when PCLK goes low, the third PMOS transistor (108) and the fourth PMOS transistor (110) switch 'on,' causing DN and SN to remain high (166, 168) or causing DN and SN to go high (170, 172). Also, when PCLK goes low (136), the seventh NMOS transistor (114) switches 'off,' creating an open circuit between DN and OUT.

At the rising edge of CLK, CLK_P goes high (148), because, due to CLK going high, one of the inputs to the first NAND gate (106) goes low, causing the first NAND gate (106) to output high on CLK_P. CLK_P pulses high for three inverter delays (150), i.e., the width of a CLK_P pulse is three inverter delays, due to the propagation delays inherent in the second, third, and fourth inverters (100, 102, 104). When CLK_P goes high (148), the fifth and sixth NMOS transistors (124, 126) switch 'on.' When the fifth NMOS transistor (124) switches 'on,' DN, which was already high, due to DN remaining high (166) when PCLK went low earlier, gets connected to the low output of the first NOR gate (122). As discussed earlier, during scan mode operations, DATA is disabled and SE is high (174), and therefore, the first NOR gate (122) outputs low. When DN goes low (175), DN switches the fifth PMOS transistor (116) 'on,' causing OUT to go high (176) since it gets connected to high through the fifth PMOS transistor (116). When the sixth NMOS transistor (126) switches 'on' due to CLK_P going high (148), and when SI goes low (164), then SN goes high since it gets connected to the output of the second NAND gate (128) through the sixth NMOS transistor (126). In other words, when SI goes low (164), the second NAND gate (128) outputs high (as discussed earlier), and since the sixth NMOS transistor (126) is switched 'on,' SN gets connected to high through the sixth NMOS transistor (126). It follows that DN is now low (178) and SN is now high (180). Subsequently, when INT_CLK goes high, the values on DN and SN get latched, i.e., stored.

Figure 7B:
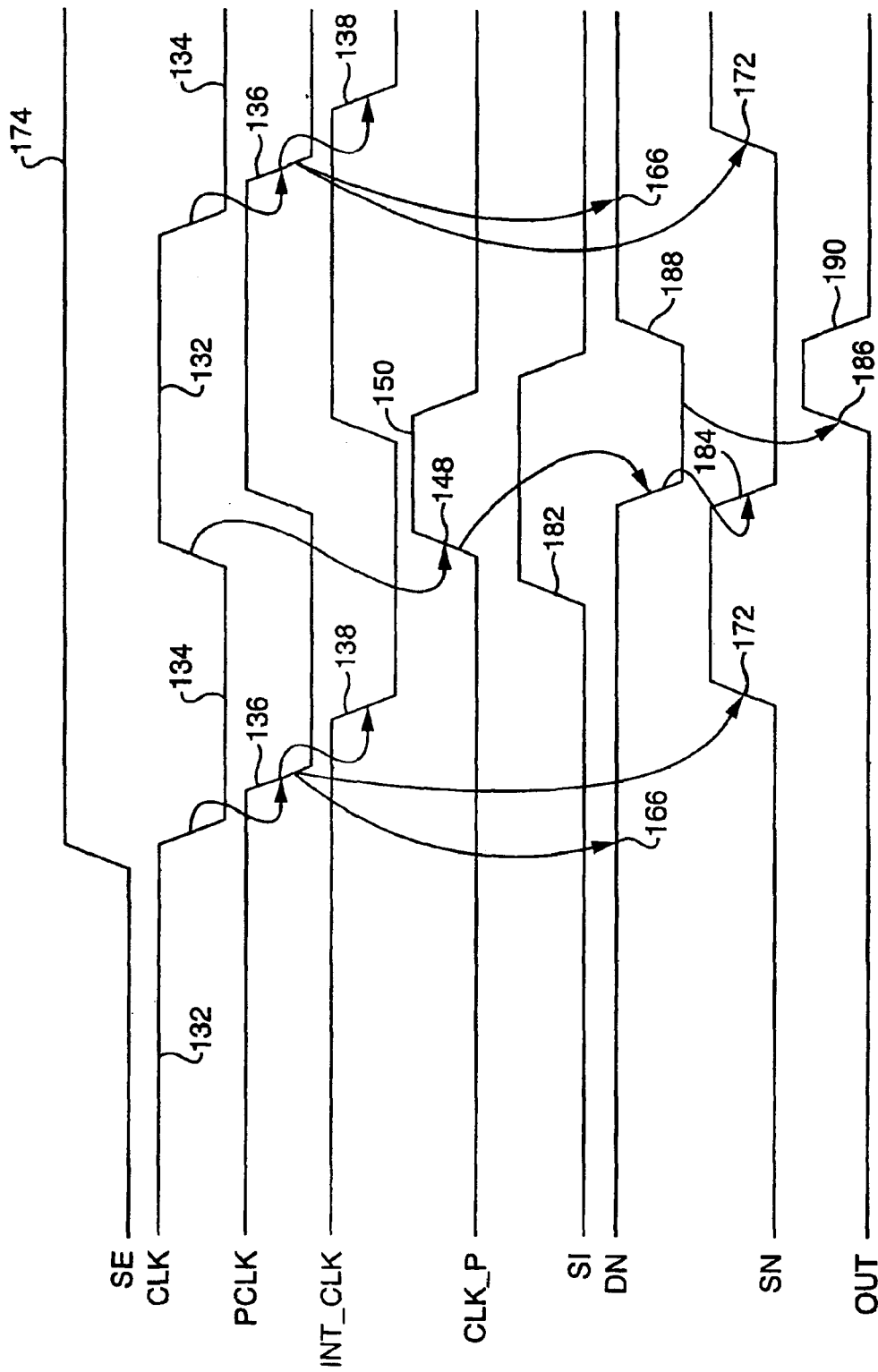
FIG. 7B shows an exemplary timing diagram in accordance with an embodiment of the present invention.

The timing diagram in FIG. 7B represents the function of the flip-flop with embedded scan logic (80) during scan mode operations, i.e., the scan enable signal is high, when the scan input, SI, goes from low to high (182). In the case that the sixth NMOS transistor (126) is switched 'on' and SI goes high (182), the second NAND gate (128) outputs low since a two-input NAND gate outputs the inverse of the second input when its first input, SE, is high. Moreover, when SI goes high (182) and the sixth NMOS transistor (126) switches 'on,' SN gets connected to the low output of the second NAND gate (128), and goes low (184), i.e., gets discharged. It follows that both DN and SN are now low. As DN is low, the fifth PMOS transistor (116) switches 'on,' causing OUT to go high (186) since it gets connected to high through the fifth PMOS transistor (116). When INT_CLK goes high and CLK_P goes low, the third NMOS transistor (94) switches 'on,' the fourth NMOS transistor (96) switches 'on,' the fifth NMOS transistor (124) switches 'off,' and the sixth NMOS transistor (126) switches 'off.' Since SN and DN are both low, the first PMOS transistor (86) is switched 'on,' the first NMOS transistor (90) is switched 'off,' the second PMOS transistor (88) is switched 'on,' and the second NMOS transistor (92) is switched 'off.' Because the first PMOS transistor (86) is stronger than the first NMOS transistor (90) and because the second NMOS transistor (92) is stronger than the second PMOS transistor (88), DN goes high (188) since it gets connected to high, i.e., gets charged, through the strong first PMOS transistor (86), and SN remains low since it is pulled down by the strong second NMOS transistor (92). An arriving rising edge on PCLK enables the data on DN to flow to OUT since the PCLK rising edge and the high value on DN switch the seventh and eighth NMOS transistors (114, 112) 'on,' respectively. Accordingly, OUT goes low (190) since it gets connected to ground through the seventh and eighth NMOS transistors (114, 112).

Advantages of the present invention may include one or more of the following. In one or more embodiments, a data input to a flip-flop with scan capabilities is inputted on one end of the flip-flop without inputting a data complement input on another end of the flip-flop.

In other embodiments, scan circuitry is embedded within flip-flop circuitry to increase performance relative to flip-flops that have scan circuitry added to flip-flop circuitry.

Alternatively, in other embodiments, a flip-flop with embedded scan logic requires less implementation space than a flip-flop that has scan circuitry added to flip-flop circuitry.

In one or more embodiments, the transistors in a flip-flop with embedded scan circuitry can be sized or skewed in order to effectuate specific behavior within the flip-flop.

In other embodiments, the transition from a data input or scan input to an output of a flip-flop with embedded scan logic occurs faster than a flip-flop with scan logic added to flip-flop circuitry.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A flip-flop circuit with embedded scan capabilities and having a master stage and a slave stage comprising:
    a data input control stage that selectively controls a value on a data node that is coupled to the master stage and the slave stage;
    a scan input control stage that selectively controls a value on a scan node that is coupled to the master stage;
    a clock input control stage that generates a plurality of clock signals dependent on a clock input thereto,
    wherein the plurality of clock signals are used to control the data input control stage, the scan input control stage, the master stage, and the slave stage, and
    wherein one of the data node and the scan node is held constant when the other of the data node and the scan node is active.

2. The flip-flop circuit of claim 1, wherein the data input control stage inputs a data input signal and a scan enable signal, and wherein the data input control stage resides on one end of the flip-flop circuit.

3. The flip-flop circuit of claim 2, wherein the scan input control stage inputs a scan input signal and a scan enable signal, and wherein the scan input control stage resides on another end of the flip-flop circuit.

4. The flip-flop circuit of claim 1, wherein the scan node is active during a scan mode.

5. The flip-flop circuit of claim 4, wherein the data node is active during a normal mode.

6. The flip-flop circuit of claim 1, wherein the master stage passes a value to the slave stage based on the values of the scan node and the data node.

7. The flip-flop circuit of claim 1, wherein the clock input control stage generates delayed and inverted clock signals to the data input control stage, the scan input control stage, the master stage, and the slave stage.

8. The flip-flop circuit of claim 7, wherein a data input signal selectively controls the value on the data node dependent upon the clock input control stage.

9. The flip-flop circuit of claim 7, wherein a scan input signal selectively controls the value on the scan node dependent upon the clock input control stage.

10. The flip-flop circuit of claim 7, wherein the master stage selectively passes a value to the slave stage dependent upon the data node, the scan node, and the clock input control stage.

11. The flip-flop circuit of claim 7, wherein the slave stage selectively controls an output of the flip-flop circuit dependent upon the data node and the clock input control stage.

12. A method for performing operations using a flip-flop with embedded scan capabilities and having a master stage and a slave stage, comprising:
    selectively controlling a value on a data node dependent upon a data input control stage and a clock input control stage, wherein the data node is coupled to the master stage and the slave stage;
    selectively controlling a value on a scan node dependent upon a scan input control stage and the clock input control stage, wherein the scan node is coupled to the master stage;
    selectively controlling the slave stage dependent upon the master stage and the clock input control stage;
    selectively generating an output of the flip-flop dependent upon the slave stage;
    generating a plurality of clock signals dependent on a clock input thereto, and
    using the plurality of clock signals to control the data input control stage, the scan input control stage, the master stage, and the slave stage,
    wherein one of the data node and the scan node is held constant when the other of the data node and the scan node is active.

13. The method of claim 12, wherein the scan node is active during a scan mode.

14. The method of claim 12, wherein the data node is active during a normal mode.

15. The method of claim 12, further comprising:
    inputting the clock input to the clock input control stage; and
    selectively generating delayed and inverted versions of the clock input therefrom.

* * * * *